(12) United States Patent
Sun

(10) Patent No.: US 10,573,707 B2
(45) Date of Patent: Feb. 25, 2020

(54) ARRAY SUBSTRATE, METHOD FOR PREPARING ARRAY SUBSTRATE, DISPLAY PANEL AND DISPLAY DEVICE

(71) Applicant: BOE TECHNOLOGY GROUP CO., LTD., Beijing (CN)

(72) Inventor: Linghong Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/986,207

(22) Filed: May 22, 2018

(65) Prior Publication Data

US 2019/0131373 A1 May 2, 2019

(30) Foreign Application Priority Data

Oct. 31, 2017 (CN) .......................... 2017 1 1049758

(51) Int. Cl.
*H01L 27/32* (2006.01)
*H01L 51/56* (2006.01)
*H01L 51/52* (2006.01)
*H01L 51/00* (2006.01)

(52) U.S. Cl.
CPC ...... *H01L 27/3276* (2013.01); *H01L 27/3246* (2013.01); *H01L 51/0021* (2013.01); *H01L 51/5206* (2013.01); *H01L 51/5209* (2013.01); *H01L 51/56* (2013.01); *H01L 2251/558* (2013.01)

(58) Field of Classification Search
CPC . H01L 27/3276; H01L 27/3246; H01L 51/56; H01L 51/5206
See application file for complete search history.

(56) References Cited

U.S. PATENT DOCUMENTS

| | | | |
|---|---|---|---|
| 9,935,287 B2 | 4/2018 | Hu et al. | |
| 2013/0119352 A1* | 5/2013 | Aurongzeb | H01L 51/0097 257/40 |
| 2016/0365531 A1 | 12/2016 | Hu et al. | |
| 2019/0006427 A1* | 1/2019 | Lu | H01L 51/5221 |
| 2019/0044077 A1* | 2/2019 | Zhang | H01L 51/0096 |

FOREIGN PATENT DOCUMENTS

| | | |
|---|---|---|
| CN | 103928626 A | 7/2014 |
| CN | 104465708 A | 3/2015 |
| CN | 106449717 A | 2/2017 |

OTHER PUBLICATIONS

First Chinese Office Action dated Aug. 2, 2019, received for corresponding Chinese Application 201711049758.4.

\* cited by examiner

*Primary Examiner* — Anthony Ho
(74) *Attorney, Agent, or Firm* — Kinney & Lange, P.A.

(57) ABSTRACT

An array substrate, a method for preparing an array substrate, a display panel and a display device are provided in the embodiments of the disclosure. The array substrate comprises a substrate and a plurality of anode layers arranged in an array on the substrate and spaced apart from another; in a range of distance from edges of the plurality of anode layers, thicknesses of the plurality of anode layers are set to increase gradually from central regions to edge regions of the plurality of anode layers.

11 Claims, 2 Drawing Sheets

ARRAY SUBSTRATE, METHOD FOR PREPARING ARRAY SUBSTRATE, DISPLAY PANEL AND DISPLAY DEVICE

CROSS-REFERENCE TO RELATED DISCLOSURE

The present disclosure claims the benefit of Chinese Patent Application Disclosure No. 201711049758.4 filed on Oct. 31, 2017 in the State Intellectual Property Office of China, the whole disclosure of which is incorporated herein by reference.

BACKGROUND OF THE DISCLOSURE

Field of the Disclosure

Embodiments of the present disclosure relate to the technical field of display, and especially to an array substrate, a method for preparing an array substrate, a display panel and a display device.

Description of the Related Art

In the technical field of display concerning an electroluminescent device (e.g., OLED or QLED) and a liquid crystal device (i.e., LCD), one of film-processing wet processes, such as ink-jet printing and the like, may typically be used to form an organic function layer film and a color film structure. A necessary step of these wet processes lies in that it is required that a structure processed by either one of these wet processes is processed by a subsequent process so as to remove/eliminate any excessive/redundant solvent therefrom, and then is further processed by a drying process so as to form a desired thin film. A specific process of such a drying process for removal of the solvent determines a topography or morphology of the film which functions as a finalized product. As to a photoelectric display device, both the topography/morphology and uniformity of the film which is dried may have a relatively great influence on both service life and display effect of the device.

SUMMARY OF THE DISCLOSURE

The embodiments of the present disclosure have been made to overcome or alleviate at least one aspect of the above mentioned disadvantages and/or shortcomings in the prior art, by providing a display substrate and a method for preparing the same, and a display device.

The following technical solutions are adopted in exemplary embodiments of the disclosure for achieving the above desired technical purposes.

According to an aspect of an exemplary embodiment of the present disclosure, there is provided an array substrate, including: a substrate; and a plurality of anode layers arranged in an array on the substrate and spaced apart from one another; and in a threshold range of distance from edges of the plurality of anode layers, thicknesses of the plurality of anode layers are set to increase gradually from central regions to edge regions of the plurality of anode layers.

In an embodiment of the disclosure, each of the plurality of anode layers includes a first anode layer and a second anode layer formed on the first anode layer; and in a threshold range of distance from an edge of a respective one of the plurality of anode layers, a thickness of the respective one of the plurality of anode layers is provided to increase gradually from a center region to an edge region of the respective one of the plurality of anode layers, including: in a threshold range of distance from an edge of a respective second anode layer of the respective one of the plurality of anode layers, a thickness of the respective second anode layer of the respective one of the plurality of anode layers is provided to increase gradually from a center region to an edge region of the respective second anode layer.

In an embodiment of the disclosure, the array substrate further includes: a plurality of light-emitting layers formed on the plurality of anode layers; and a plurality of pixel-definition layers formed on the substrate and interposed among neighboring ones of the plurality of light-emitting layers and among neighboring ones of the plurality of anode layers so as to space apart the neighboring ones of the plurality of light-emitting layers.

In an embodiment of the disclosure, the array substrate further includes: a plurality of light-emitting layers, each of which is formed on the respective second anode layer of the respective one of the plurality of anode layers and a plurality of pixel-definition layers formed on the substrate and interposed among neighboring ones of the plurality of light-emitting layers and among neighboring ones of the plurality of anode layers so as to space apart the neighboring ones of the plurality of light-emitting layers.

In an embodiment of the disclosure, the substrate includes: a base substrate; and a gate electrode layer, a gate insulating layer, a semiconductor layer, a source/drain layer, a passivation layer, and a planarization layer formed on the base substrate and overlapping with one another.

According to another aspect of the exemplary embodiment of the present disclosure, there is provided a method for preparing an array substrate, including: providing a substrate; forming an electrode layer on the substrate; and forming a plurality of anode layers arranged in an array on the substrate and spaced apart from one another by processing the electrode layer; in a threshold range of distance from edges of the plurality of anode layers, thicknesses of the plurality of anode layers are set to increase gradually from central regions to edge regions of the plurality of anode layers.

In an embodiment of the disclosure, the method further includes forming an electrode layer on the substrate includes forming a first electrode layer on the substrate and a second electrode layer on a surface of the first electrode layer facing away from the substrate; and forming a plurality of anode layers arranged in an array on the substrate and spaced apart from one another by processing the electrode layer includes: forming a plurality of first anode layers arranged in an array on the substrate by processing the first electrode layer; and forming a plurality of second anode layers arranged above the plurality of first anode layers by patterning on the second electrode layer by a halftone masking process; and in a threshold range of distance from an edge of a respective second anode layer of the respective one of the plurality of anode layers, thicknesses of the respective second anode layer of the respective one of the plurality of anode layers is provided to increase gradually from a center region to an edge region of the respective second anode layer.

In an embodiment of the disclosure, the method further includes: forming a plurality of pixel-definition layers on the substrate by evaporation.

In an embodiment of the disclosure, the method further includes: forming slits among the plurality of anode layers which slits expose the substrate for the evaporation of the plurality of pixel-definition layers, followed by forming the plurality of pixel-definition layers on the substrate by evaporation.

In an embodiment of the disclosure, forming slits among the plurality of anode layers which slits expose the substrate for the evaporation of the plurality of pixel-definition layers further includes: presetting the slits among the plurality of anode layers to expose the substrate.

In an embodiment of the disclosure, forming slits among the plurality of anode layers which slits expose the substrate for the evaporation of the plurality of pixel-definition layers further includes: presetting the slits among the plurality of anode layers to expose the substrate.

In an embodiment of the disclosure, the method further includes: forming a plurality of light-emitting layers on the plurality of anode layers by printing.

According to another aspect of the exemplary embodiment of the present disclosure, there is provided a display panel, including the array substrate as above.

According to another aspect of the exemplary embodiment of the present disclosure, there is provided a display device, including the display panel as above.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS OF THE DISCLOSURE

Figure 1:
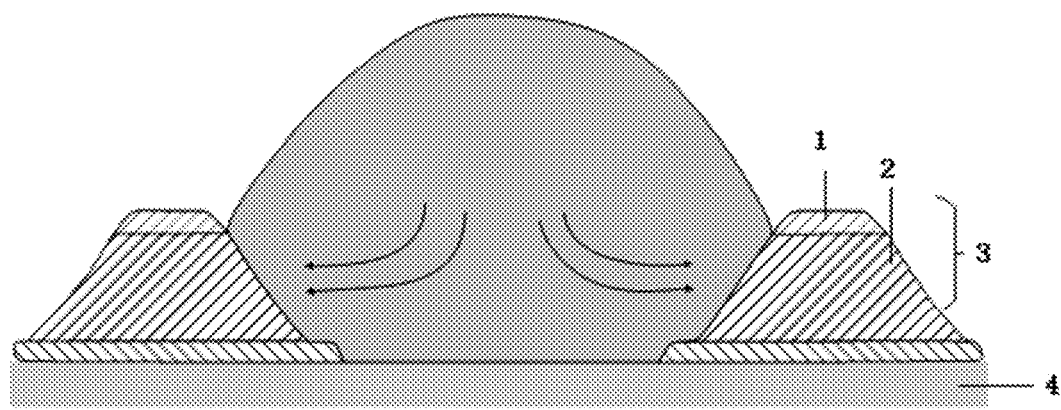
FIG. 1 illustrates a longitudinal sectional topographical/morphological view of an ink droplet dripped into a pixel pit having a Bank for delimitation thereof in relevant art.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of an array substrate, a display panel and a display device.

In a solution of the relevant art, in film-processing wet processes, it is required that a structure processed thereby is processed by a subsequent process to remove/eliminate any excessive/redundant solvent therefrom, and then is further processed by a drying process to form a desired thin film.

However, during the drying process, once an ink droplet drops onto a substrate or into a pixel, then there is a difference in evaporation rate between a central portion of the ink droplet and an edge portion of the ink droplet which has a relative larger ratio between volume and unit area than that of the central portion, due to a shape the ink droplet on the substrate or in the pixel assumes, such that the ink droplet has a faster drying rate at the edge portion thereof. As the solvent at the edge portion of the ink droplet volatilizes continually/ceaselessly, a distribution of solid contents may vary between the central portion and the edge portion, resulting in a difference in concentration gradients and in turn a migration phenomenon of the solvent from the central portion towards the edge portion of the ink droplet due to a capillary compensation flow. Such a flow of the solvent may necessarily bring a portion of a solute contained therein to migrate towards the edge portion such that an amount of the solute at the edge portion increases continually. Therefore, a coffee-ring (stain) effect is caused thereby.

Furthermore, in addition to the aforementioned capillary compensation flow from the central portion towards the edge portion of the ink droplet, there is also a reverser flow phenomenon inside the droplet which is referred to as Marangoni phenomenon which cooperates with the capillary compensation flow phenomenon such that a topography or morphology of a thin film which functions as a finalized product may be determined by such two micro-flow effects collectively. It is found by research that an essential cause for the Marangoni convection flow lies in a difference in surface tension gradients at different locations within the droplet. And several factors may contribute to a generation of the difference in surface tension gradients, such as, temperature gradients, concentration gradients, variation of solvent composition, and the like.

In a process for preparing a display panel of the electroluminescent device, it is required that there is a layer of material for delimiting a pixel, i.e., a so-called "pixel-definition layer" which is typically referred to as "Bank". In other words, in a preparation of a practical display device, a shape of the pixel of the display panel is defined by a material of said "pixel-definition layer" which defines the edge of the pixel. In a process of the solution, e.g., in an ink-jet printing process, there may be some additional requirements for the pixel-definition layer: firstly, a thickness of the pixel-definition layer needs to be as thick as possible, e.g., 1-2 μm, such that the ink for printing may be stored during the process for preparation; secondly, a requirement for a material of the pixel-definition layer is of great importance, i.e., the material of the pixel-definition layer is selected such that its surface has a relatively strong lyophobic property so as to avoid mixture of ink among adjacent pixels and to avoid simultaneous fall-down of a dripped ink droplet into the pixel pit, e.g., due to its own gravity, which droplet would have been located at a border between or among adjacent pixels but is practically displaced by a micro offset, i.e., an ink droplet dripped onto an inner edge of the pixel.

Figure 2:
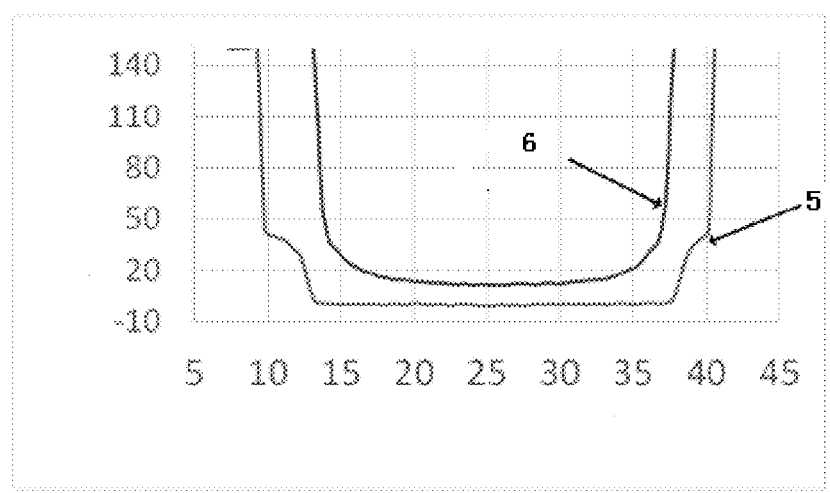
FIG. 2 illustrates a schematic view of a profile obtained by a practical measurement at a longitudinal section of a thin film after being dried in relevant art.

In addition, as to an induction of the coffee-ring (stain) effect, another condition should also be taken into consideration, i.e., a pinning effect at a contact line between the droplet and an interface between liquid and solid. Both a movement and the pinning of the contact line may be complicated processes influenced by lyophilic/lyophobic property at the interface and the properties of the ink (such as boiling point, viscosity, and surface tension and the like), and may also be relevant to other factors such as a magnitude at the interface between liquid and solid. By way of example, a use of the pixel-definition layer "Bank" may enhance the pinning effect of the contact line, such that the contact line is always secured at an edge of the Bank during the whole drying process, typically resulting in an increase in the coffee-ring (stain) effect. Especially, as to materials for the Bank at present, only a very thin layer of material at surfaces thereof may possess the lyophobic property, and underlying layers of material(s) which occupy most proportion thereof may be lyophilic. FIG. 1 illustrates a longitudinal sectional topographical/morphological view of an ink droplet dripped into a pixel pit having a Bank for delimitation thereof, wherein reference numeral '2' indicates a lyophilic layer, reference numeral '1' indicates a lyophobic layer on the lyophilic layer, reference numeral '4' indicates a first Bank sub-layer, and reference numeral '3' indicates a second Bank sub-layer which is located on the first Bank sub-layer '4' and includes the lyophobic layer '1' and the lyophilic layer '2'. FIG. 2 illustrates a schematic view of a profile obtained by a practical measurement at a longitudinal section of a thin film after being subject to the drying process, where a horizontal axis thereof indicates a width of a pixel (with a unit of 'μm'), and a vertical axis thereof indicates a thickness of an OLED layer (with a unit of 'nm'), reference numeral '5' indicates said pixel-definition layer 'Bank' including the first Bank sub-layer and the second Bank sub-layer, and reference numeral '6' indicates the OLED layer defined/delimited by the 'Bank' layer. As illustrated in FIG. 1 and FIG. 2, most of organic functional materials (such as a material for a hole-injection layer, and the like) are located within the pixel at the edge portion adjacent to the 'Bank', resulting in the unevenness of the surface of the pixel thin film thus prepared, and the coffee-ring (stain) effect.

Figure 3:
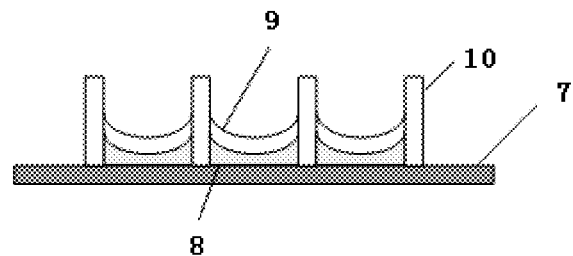
FIG. 3 illustrates a structural schematic view of an array substrate according to an embodiment of the disclosure.

According to a general technical concept of embodiments of the present disclosure, as shown in FIG. 3, a structural schematic view of an array substrate is illustrated according to an embodiment of the disclosure. As illustrated, there is provided an array substrate, e.g., including a substrate 7, and a plurality of anode layers 8 arranged in an array on the substrate 7 and spaced apart from one another. In a predetermined threshold range of distance from edges of the plurality of anode layers 8, a respective thickness of each of the plurality of anode layers 8 spaced apart from one another by respective pixel-definition layers is set to increase gradually from a respective central region to a respective edge region of the respective one of the plurality of anode layers 8.

In an embodiment of the disclosure, a respective thickness of each of the plurality of anode layers 8 spaced apart from one another by respective pixel-definition layers is set to increase gradually from the respective central region to the respective edge region of the respective one of the plurality of anode layers 8, by improving shape of the respective one of the plurality of anode layers 8, i.e., by forming the respective one of the plurality of anode layers 8 into the predetermined threshold range of distance from edges of the plurality of anode layers 8, such that various anode layers 8 may for example cooperate with the ink droplet dripped onto the substrate or into the pixel when a light-emitting material continues to be printed on an electrode, so as to improve the ratio between volume and unit area of both the central portion and the edge portion of the ink droplet and in turn to avoid effectively the coffee-ring (stain) effect, resulting in that the film layer has a uniform thickness and uniformity of the film which is formed by printing is also enhanced.

In a practical application, the predetermined threshold range of distance may be selected as per practical requirements, e.g., 5 mm, or alternatively 3 mm, and the like, without being limited herein in embodiments of the disclosure.

Figure 4:
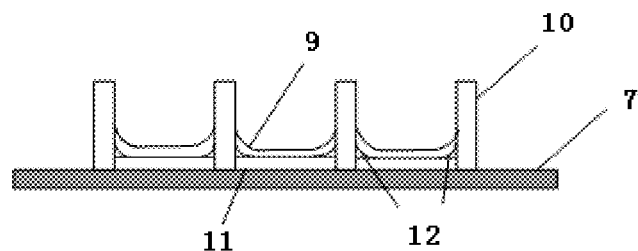
FIG. 4 illustrates a structural schematic view of an array substrate according to an embodiment of the disclosure.

In an embodiment of the disclosure, as illustrated in FIG. 4, a structural schematic view of an array substrate is illustrated according to an embodiment of the disclosure. As illustrated, each of the plurality of anode layers 8 include a first anode layer 11 and a second anode layer 12 formed on the first anode layer 11, with a light-emitting layer 9 being formed on the second anode layer 12, such that said condition of "a respective thickness of each of the plurality of anode layers 8 spaced apart from one another by respective pixel-definition layers is set to increase gradually from a respective central region to a respective edge region of the respective one of the plurality of anode layers 8" may for example be implemented as below:

In a threshold range of distance from an edge of a respective second anode layer 12 of the respective one of the plurality of anode layers, thickness of the respective second anode layer 12 of the respective one of the plurality of anode layers is set to increase gradually from a center region to an edge region of the respective second anode layer 12.

The thickness of the edge region of each second anode layer 12 is influenced by both the solution and the material of the pixel-definition layer, for example, thicknesses of both the central region and the edge region of each of the plurality of anode layers may be defined by choosing appropriate solution and the material for the pixel-definition layer. Certainly, by way of example, the thicknesses of both the central portion and the edge portion of each of the plurality of anode layers may be set to be other values, without being limited in embodiments of the disclosure.

Furthermore, in an exemplary embodiment of the disclosure, in the predetermined threshold range of distance from an edge of a respective second anode layer 12, e.g., variation regularities of the thicknesses of the second anode layers 12 spaced apart by respective pixel-definition layers from respective central regions towards respective edge regions are essentially the same, i.e., are embodied in that gradients of thickness variations in directions from respective central region to respective edge region thereof remain unchanged.

Certainly, in practical application, the thicknesses falling within the predetermined threshold range of distance from an edge of a respective second anode layer 12 may for example change uniformly, or alternatively change non-uniformly, without being limited in embodiments of the disclosure.

It should be understood that above embodiments are examples which are exemplified and only intended to provide a better understanding of solutions of embodiments of the disclosure, rather than exclusive limitation onto the embodiments of the disclosure.

In another exemplary embodiment of the disclosure, e.g., the substrate 7 further includes: a base substrate (or an underlying substrate); and a gate electrode layer, a gate insulating layer, a semiconductor layer, a source/drain layer, a passivation layer, and a planarization layer laminated on the base substrate and overlapping with one another. It should be understood that, both the base substrate contained in the substrate 7, and various layers formed on the base substrate (i.e., the gate electrode layer, the gate insulating layer, the semiconductor layer, the source/drain layer, the passivation layer, and the planarization layer), are identical to those structures with the same name in solutions of relevant art, without repeating herein any more.

In another exemplary embodiment of the disclosure, e.g., as illustrated in FIG. 1, the array substrate may further include: a plurality of light-emitting layers 9 formed on the plurality of anode layers 8, e.g., on respective second anode layers 12; and a plurality of pixel-definition layers 10 formed on the substrate 7, each being interposed among two neighboring light-emitting layers 9 and among neighboring ones of the plurality of anode layers 8 so as to space apart the neighboring ones of the plurality of light-emitting layers.

In addition, for example, each of the plurality of light-emitting layers 9 further includes: a hole-injection layer, a hole-transporting layer, a luminescent layer (e.g., an electroluminescent layer), an electron-transporting layer, and an electron-injection layer. It should be understood that, the various layers contained by the light-emitting layer 9, i.e., the hole-injection layer, the hole-transporting layer, the luminescent layer, the electron-transporting layer, and the electron-injection layer are identical to those structures with the same name in solutions of relevant art, without repeating herein any more.

As to the array substrate according to the embodiment of the disclosure, each of the plurality of anode layers spaced apart from one another by respective pixel-definition layers is shaped to have a respective thickness increasing gradually from the respective central region to the respective edge region of the respective one of the plurality of anode layers, by forming the respective one of the plurality of anode layers which are arranged in an array on the substrate into the predetermined threshold range of distance from edges of the plurality of anode layers, so as to avoid effectively the coffee-ring (stain) effect when a light-emitting material continues to be printed on an electrode, resulting in that the film layer has a uniform thickness and uniformity of the film which is formed by printing is also enhanced, such that a planarization/flatness of the pixel thin film and a uniform brightness of the electroluminescent device upon illumination may be ensured, and a utilization efficiency of the material may be enhanced.

Figure 5:
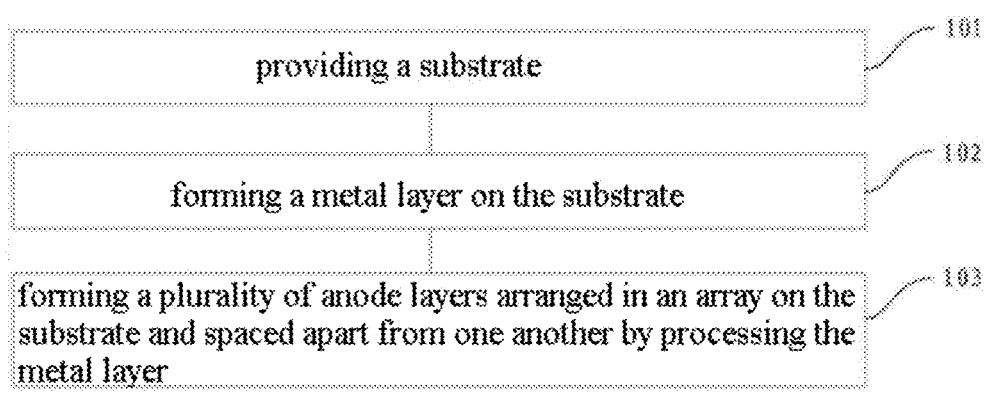
FIG. 5 illustrates a flow chart of steps of a method for preparing an array substrate according to an embodiment of the disclosure.

In another exemplary embodiment of the disclosure, as illustrated in FIG. 5, a flow chart illustrates steps of a method for preparing an array substrate according to an embodiment of the disclosure. For example, the method includes following steps:

Step 101: providing a substrate;
Step 102: forming an electrode layer on the substrate; and
Step 103: forming a plurality of anode layers arranged in an array on the substrate and spaced apart from one another by processing the electrode layer.

Specifically, in an embodiment of the disclosure, in said step 101, before a preparation of the anode layers is complete, firstly, a substrate should be provided which may for example be (but not being limited to) an insulative substrate such as a glass substrate, a plastic substrate, and the like.

The substrate, for example, includes a base substrate or an underlying substrate, and a method for preparing the base substrate includes: forming a gate electrode layer, a gate insulating layer, a semiconductor layer, a source/drain layer, a passivation layer, and a planarization layer which are overlapping with one another, on the base substrate.

The method for preparing the substrate according to the embodiment of the disclosure is an improvement on processes for the plurality of anode layers, and are essentially the same as a method for preparing a substrate as typically adopted in the relevant art, without repeating herein any more.

In said step 102, for example, an electrode layer is formed on the substrate thus provided, a material of the electrode layer including (but not being limited to) any one or more of Indium Tin Oxide (ITO), Indium Zinc Oxide (IZO) and the like.

In an embodiment of the disclosure, as to a specific processing process for forming the electrode layer, the electrode layer is typically formed by sputtering metal atoms onto the base substrate by bombarding metal targets by a gas with a sputtering process above the base substrate.

It should be understood that the above example is an implementation for forming a metal layer on the substrate which is exemplified for a better understanding of the solution of embodiments of the disclosure. In practical application, any implementation for forming an electrode layer on the substrate may be adopted by those skilled in the art, without being limited thereto in embodiments of the disclosure.

In said step 103, for example, the electrode layer formed on the substrate is processed so as to form the plurality of anode layers arranged in an array on the substrate. And in a predetermined threshold range of distance from edges of the plurality of anode layers, thicknesses of the plurality of anode layers are set to increase gradually from central regions to edge regions of the plurality of anode layers.

In an exemplary embodiment of the disclosure, each of the plurality of anode layers includes a first anode layer and a second anode layer formed on the first anode layer; and in a predetermined threshold range of distance from an edge of a respective second anode layer of the respective one of the plurality of anode layers, a thickness of the respective second anode layer of the respective one of the plurality of anode layers is provided to increase gradually from a center region to an edge region of the respective second anode layer.

In an exemplary embodiment of the disclosure, forming an electrode layer on the substrate includes forming a first electrode layer on the substrate and a second electrode layer on a surface of the first electrode layer facing away from the substrate, and correspondingly, above step 103 for example includes:

Step S1: forming a plurality of first anode layers arranged in an array on the substrate by processing the first electrode layer; and Step S2: forming a plurality of second anode layers arranged above the plurality of first anode layers by patterning on the second electrode layer by a halftone masking process.

Specifically, in an embodiment of the disclosure, the electrode layer for example includes: a first electrode layer and a second electrode layer on the surface of the first electrode layer facing away from the substrate. Correspondingly, above all, in the step S1, e.g., the plurality of first anode layers each of which has a planarization surface may be formed by processing the first electrode layer; and then, in step S2, e.g., the second electrode layer is patterned by a halftone masking process so as to form the plurality of second anode layers arranged above the plurality of first anode layers, such that the respective second anode layer of the respective one of the plurality of anode layers is shaped to have a respective thickness increasing gradually from a center region to an edge region of the respective second anode layer, in a threshold range of distance from an edge of a respective second anode layer of the respective one of the plurality of anode layers, and then the respective second anode layers may for example cooperate with the ink droplet dripped onto the substrate or into the pixel when a light-emitting material continues to be printed on an electrode, so as to improve the ratio between volume and unit area of both the central portion and the edge portion of the ink droplet and in turn to avoid effectively the coffee-ring (stain) effect, resulting in that the film layer has a uniform thickness and uniformity of the film which is formed by printing is also enhanced.

And it may be understood that the halftone masking process is a common fabricating process used in solutions of relevant art, without repeating any more in embodiments of the disclosure.

In an exemplary embodiment of the disclosure, furthermore, e.g., pixel-definition layers may be formed on the substrate by evaporation.

Specifically, for example, slits are formed, each of which is formed in two adjacent anode layers of the plurality of anode layers thus formed, e.g., by presetting or by processing (e.g., by etching) so as to expose the substrate therefrom; and then pixel-definition layers are formed by evaporation among the slits, the pixel-definition layers being in touch with the substrate.

In practical application, the pixel-definition layers may be prepared by other implementations by those skilled in the art, without being limited in embodiments of the disclosure.

In an exemplary embodiment of the disclosure, e.g., after a preparation of both the pixel-definition layers and the anode layers on the substrate is completed, then the electroluminescent device is further fabricated on the anode layers. By way of example, a plurality of light-emitting layers are formed on the plurality of anode layers by printing, such as a hole-injection layer, a hole-transporting layer, an electroluminescent layer, an electron-transporting layer, and an electron-injection layer, and the like.

It may be understood that specific ways for fabricating the electroluminescent device may, for example, be any one fabricating way which is feasible in solution of the relevant art, without repeating any more in embodiments of the disclosure.

As to the method for preparing an array substrate according to embodiments of the disclosure, each of the plurality of second anode layers is shaped to have a respective thickness increasing gradually from the respective central region to the respective edge region of the respective one of the second anode layers by forming the respective second anode layers which are arranged in an array on the substrate into the predetermined threshold range of distance from edges of the respective second anode layers, so as to avoid effectively the coffee-ring (stain) effect when a light-emitting material continues to be printed on an electrode, resulting in that the film layer has a uniform thickness and uniformity of the film which is formed by printing is also enhanced, such that a planarization/flatness of the pixel thin film and a uniform brightness of the electroluminescent device upon illumination may be ensured, and a utilization efficiency of the material may be enhanced.

Moreover, a display panel is further provided according to another embodiment of the disclosure, which includes the array substrate as above, and thus possesses advantages of the array substrate, without repeating herein anymore.

Furthermore, a display device is also provided according to still another embodiment of the disclosure, which includes above display panel and thus possesses advantages of both the array substrate and the display panel, without repeating herein any more.

As compared with relevant art, exemplary embodiments of the disclosure may provide some beneficial effects as below:

An array substrate and a method for preparing the same, a display panel and a display device are provided in embodiments of the disclosure. Each of the plurality of anode layers spaced apart from one another by respective pixel-definition layers is shaped to have a respective thickness increasing gradually from the respective central region to the respective edge region of the respective one of the plurality of anode layers, by forming the respective one of the plurality of anode layers which are arranged in an array on the substrate into the predetermined threshold range of distance from edges of the plurality of anode layers, so as to avoid effectively the coffee-ring (stain) effect when a light-emitting material continues to be printed on an electrode, resulting in that the film layer has a uniform thickness and uniformity of the film which is formed by printing is also enhanced, such that a planarization/flatness of the pixel thin film and a uniform brightness of the electroluminescent device upon illumination may be ensured, and a utilization efficiency of the material may be enhanced.

Various embodiments of the present application have been illustrated progressively, the same or similar parts of which can be referred to each other. The differences between each embodiment and the others are described in emphasis.

In depictions of the embodiments of the disclosure, terms "up/over" and "down/below" or the like indicating the position or positional relationship are based on the orientation or positional relationships shown in the drawings, and are merely used for convenience of describing the simplified description of the technical solutions of the present disclosure, it doesn't mean that the taught or suggested device or element must have a particular orientation, and must be constructed and operated in a particular orientation, and therefore these terms should not be construed as limiting the present disclosure.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "including", "comprising" or "having" an element or a plurality of elements having a particular property may include additional such elements not having that property.

What is claimed is:

1. An array substrate, comprising:
   a substrate; and
   a plurality of anode layers arranged in an array on the substrate and spaced apart from one another;
   wherein in a threshold range of distance from edges of the plurality of anode layers, thicknesses of the plurality of anode layers are set to increase gradually from central regions to edge regions of the plurality of anode layers.

2. The array substrate according to claim 1, wherein each of the plurality of anode layers comprises a first anode layer and a second anode layer formed on the first anode layer; and
   wherein in a threshold range of distance from an edge of a respective one of the plurality of anode layers, a thickness of the respective one of the plurality of anode layers is provided to increase gradually from a center region to an edge region of the respective one of the plurality of anode layers; and
   in a threshold range of distance from an edge of a respective second anode layer of the respective one of the plurality of anode layers, a thickness of the respective second anode layer of the respective one of the plurality of anode layers is provided to increase gradually from a center region to an edge region of the respective second anode layer.

3. The array substrate according to claim 2, further comprising:
   a plurality of light-emitting layers, each of which is formed on the respective second anode layer of the respective one of the plurality of anode layers and
   a plurality of pixel-definition layers formed on the substrate and interposed among neighboring ones of the plurality of light-emitting layers and among neighboring ones of the plurality of anode layers so as to space apart the neighboring ones of the plurality of light-emitting layers.

4. A display panel, comprising the array substrate according to claim 2.

5. A display panel, comprising the array substrate according to claim 3.

6. The array substrate according to claim 1, further comprising:
   a plurality of light-emitting layers formed on the plurality of anode layers; and
   a plurality of pixel-definition layers formed on the substrate and interposed among neighboring ones of the plurality of light-emitting layers and among neighboring ones of the plurality of anode layers so as to space apart the neighboring ones of the plurality of light-emitting layers.

7. A display panel, comprising the array substrate according to claim 6.

8. The array substrate according to claim 1, wherein the substrate comprises:
   a base substrate; and
   a gate electrode layer, a gate insulating layer, a semiconductor layer, a source/drain layer, a passivation layer, and a planarization layer formed on the base substrate and overlapping with one another.

9. A display panel, comprising the array substrate according to claim 8.

10. A display panel, comprising the array substrate according to claim 1.

11. A display device, comprising the display panel according to claim 10.

* * * * *